(12) United States Patent
Uchida

(10) Patent No.: US 8,754,721 B2
(45) Date of Patent: Jun. 17, 2014

(54) ELECTRONIC COMPONENT AND SIGNAL TRANSMISSION METHOD USING THE ELECTRONIC COMPONENT

(75) Inventor: Shinichi Uchida, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 374 days.

(21) Appl. No.: 13/064,684

(22) Filed: Apr. 8, 2011

(65) Prior Publication Data

US 2011/0260808 A1 Oct. 27, 2011

(30) Foreign Application Priority Data

Apr. 23, 2010 (JP) ................................. 2010-099798

(51) Int. Cl.
*H04B 3/04* (2006.01)
*H03H 7/20* (2006.01)

(52) U.S. Cl.
CPC ... *H04B 3/04* (2013.01); *H03H 7/20* (2013.01)
USPC ............................................. 333/18; 333/139

(58) Field of Classification Search
CPC .................................... H04B 3/04; H03H 7/20
USPC ............ 320/108; 307/82, 104; 333/112, 17.1, 333/18, 138–140; 336/100, 105, 150; 343/796; 323/355
See application file for complete search history.

(56) References Cited

U.S. PATENT DOCUMENTS 7,521,890 B2 * 4/2009 Lee et al. ...................... 320/108

FOREIGN PATENT DOCUMENTS

| JP | 03-254207 A | 11/1991 |
| JP | 8-162331 A | 6/1996 |
| JP | 2001-325574 A | 11/2001 |
| JP | 2004-229406 A | 8/2004 |
| JP | 2005-327931 A | 11/2005 |
| JP | 2007-336416 A | 12/2007 |
| JP | 2009-152254 A | 7/2009 |
| JP | 2010-087398 A | 4/2010 |

OTHER PUBLICATIONS

Japanese Notification of Reasons for Refusal, dated Dec. 3, 2013 with English translation.

* cited by examiner

*Primary Examiner* — Benny Lee
*Assistant Examiner* — Rakesh Patel
(74) *Attorney, Agent, or Firm* — McGinn IP Law Group, PLLC

(57) ABSTRACT

Multiple transmission inductors are formed over a substrate. A signal input channel is coupled to the multiple transmission inductors and a same transmission signal is inputted to the multiple transmission inductors. A phase difference control section is provided in the signal input channel and controls a phase difference of the signal between the transmission inductors by a unit smaller than 180°.

7 Claims, 7 Drawing Sheets

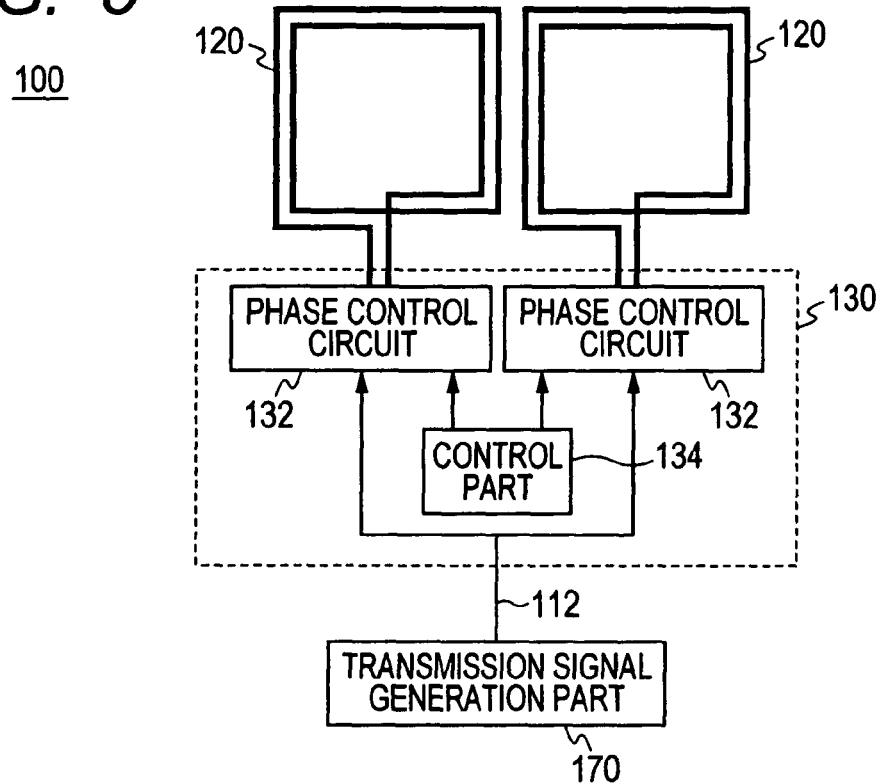
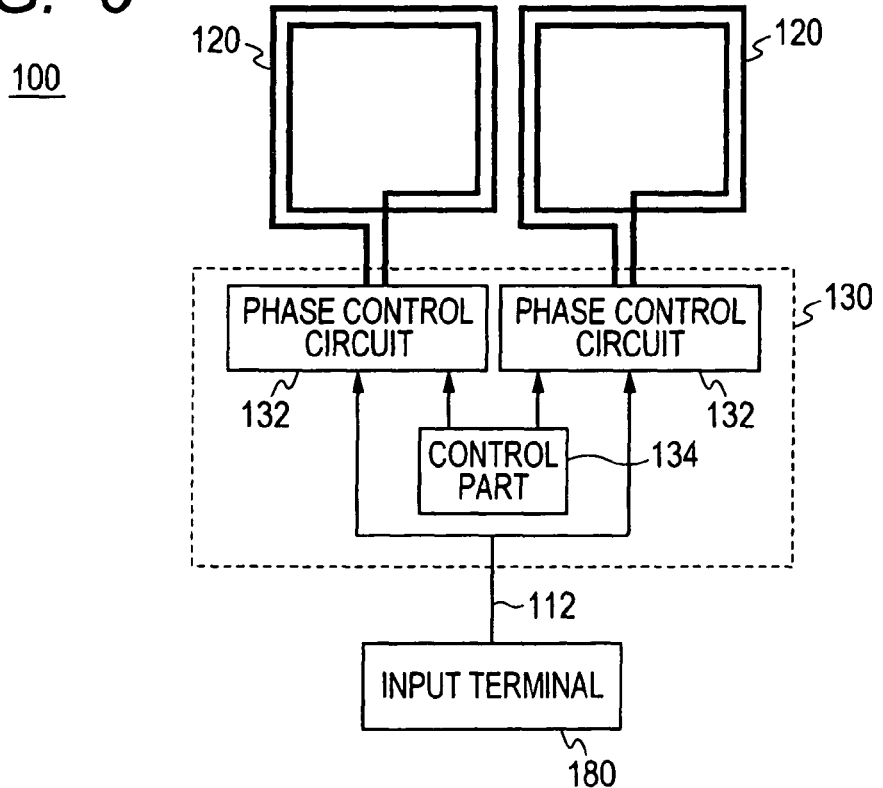

ELECTRONIC COMPONENT AND SIGNAL TRANSMISSION METHOD USING THE ELECTRONIC COMPONENT

CROSS-REFERENCE TO RELATED APPLICATIONS

The disclosure of Japanese Patent Application No. 2010-99798 filed on Apr. 23, 2010 including the specification, drawings, and abstract is incorporated herein by reference in its entirety.

BACKGROUND

The present invention relates to an electronic component having an inductor for transmitting a signal and a signal transmission method using the electronic component.

One method of transmitting a signal between different circuits is a method of using inductors. In this method, a transmission inductor and a reception inductor are arranged opposite to each other and a signal is transmitted by the use of an inductive coupling of them.

Japanese Unexamined Patent Publication No. 2005-327931 discloses a technique of containing magnetic flux in a local area by coupling two inductors in such a way that the directions of current are opposite to each other.

Further, Japanese Unexamined Patent Publication No. Hei 8 (1996)-162331 discloses a technique of varying the value of inductance by providing multiple inductors and turning on/off these inductors by a transistor.

Still further, Japanese Unexamined Patent Publication No. 2009-152254 discloses the following technique: that is, a first inductor is formed in a wiring layer, and a second indictor is formed in a rewiring layer, and the amplitude and/or phase of current of a signal inputted to the first inductor is controlled to vary magnetic flux passing through the second inductor. Specifically, there are disclosed the fact that when the phase of a signal inputted to the first inductor is made the same as the phase of a signal inputted to the second inductor, magnetic flux passing through the second inductor is increased and the fact that when the phase of a signal inputted to the first inductor is opposite to the phase of a signal inputted to the second inductor, magnetic flux passing through the second inductor is decreased.

SUMMARY

When an inductor is formed by the use of the process of manufacturing a semiconductor, the inductor can be reduced in size. On the other hand, when a signal is transmitted by the use of the inductive coupling of the inductors, a range in which the signal is transmitted by the inductor is determined by the distribution of magnetic flux produced by the transmission inductor. When the transmission inductor is reduced in size, a range in which the density of the magnetic flux is high is narrowed along with a reduction in size and an area in which a reception inductor can receive the signal is made small. For this reason, when the transmission inductor and the reception inductor are reduced in size, depending on the accuracy of the relative positions of the transmission inductor and the reception inductor, the reception inductor cannot receive the signal in some cases.

According to an aspect of the present invention, there is provided an electronic component including:

multiple transmission inductors formed over a substrate and arranged in such a way that their centers are deviated from each other when viewed in a plan view, a signal input channel which inputs a transmission signal to each of the transmission inductors, and a phase difference control section which controls a phase difference of the transmission signal between the transmission inductors by a unit smaller than 180°, the phase difference control section being provided in the signal input channel.

According to the aspect of the present invention, the electronic component includes the multiple transmission inductors. These transmission inductors have their centers deviated from each other when viewed in a plan view. A phase difference between the transmission signals inputted to the transmission inductors is controlled by the phase difference control section by a unit smaller than 180°. For this reason, when the phase difference is controlled, the centers of the magnetic fluxes formed by the transmission inductors can be deviated in a plane parallel to the substrate. Hence, even when the transmission inductors are deviated from the reception inductor in their relative positions, it is possible to prevent that the reception inductor cannot receive the signal.

According to another aspect of the present invention, there is provided a signal transmission method of: inputting a transmission signal to each of multiple transmission inductors, and controlling a phase difference of the transmission signal between the transmission inductors by a unit smaller than 180°, the transmission inductors being arranged in such a way that their centers are deviated from each other when viewed in a plan view and being opposite to a reception inductor.

According to the aspect of this invention, even if the transmission inductors are deviated from the reception inductor in their relative positions, it is possible to prevent that the reception inductor cannot receive the signal.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a view to show the configuration of an electronic component according to a third embodiment;

FIG. 6 is a view to show the configuration of an electronic component according to a fourth embodiment;

DETAILED DESCRIPTION

Hereinafter, embodiments of the present invention will be described with reference to the drawings. In all drawings, the same constituent elements are denoted by the same reference symbols and their descriptions will be omitted as appropriate.

First Embodiment

Figure 1:
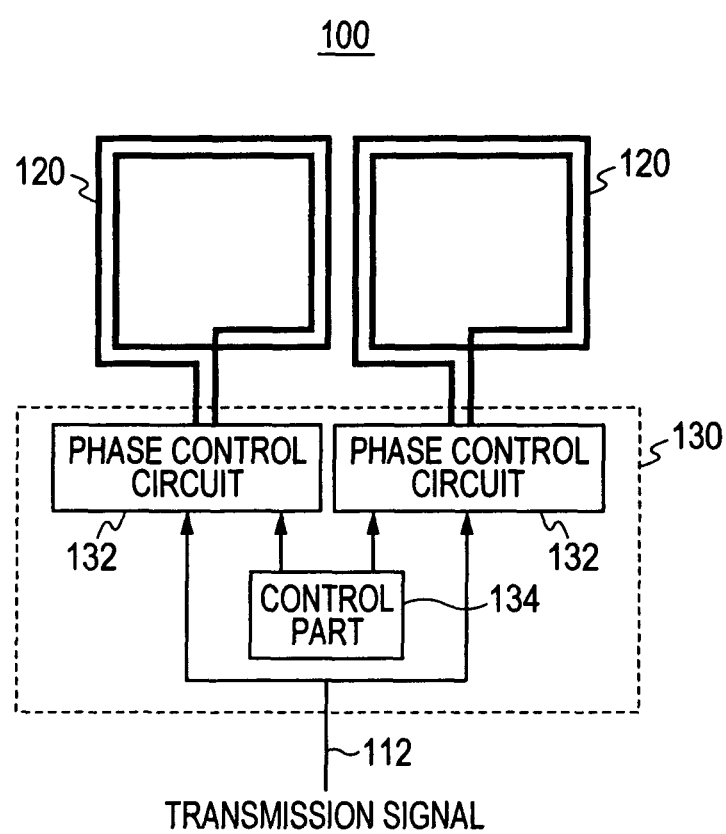
FIG. 1 is a view to show the configuration of an electronic component according to a first embodiment.
Figure 2:
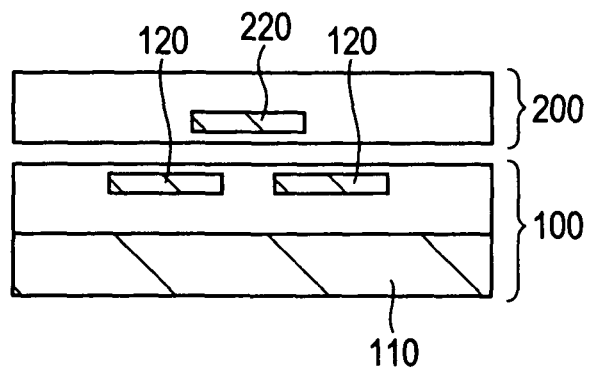
FIG. 2 is a section view to show a sectional structure of an electronic component in combination with the mode of its use.

FIG. 1 is a view to show the configuration of an electronic component 100 according to a first embodiment. FIG. 2 is a section view to show a sectional structure of the electronic component 100 in combination with the mode of its use. The electronic component 100 includes a substrate 110, multiple (for example, two) transmission inductors 120, a signal input channel 112, and a phase difference control section 130 and has a function of transmitting a signal to an electronic component 200. The multiple transmission inductors 120 are formed over the substrate 110. The signal input channel 112 is coupled to the multiple transmission inductors 120 and inputs the same transmission signal to the multiple transmission inductors 120. The phase difference control section 130 is provided in the signal input channel 112 and controls the phase difference of the signal between the multiple transmission inductors 120 by a unit smaller than 180°. Hereinafter, the electronic component 100 will be described in detail.

The substrate 110 is a semiconductor substrate, for example, a silicon substrate, but is not limited to this. Multiple wiring layers are formed over the substrate 110. The multiple transmission inductors 120 are formed in any of the wiring layers and their central axes are vertical to the substrate 110. In an example shown in the drawing, the multiple transmission inductors 120 are formed in the same wiring layer and are arranged not to overlap each other when viewed in a plan view. The diameter of the transmission inductor 120 is, for example, 100 μm or more and 1000 μm or less. The signal input channel 112 is comprised of wirings, vias, and contacts which are formed in the multiple wiring layers.

The phase difference control section 130 includes phase control circuits 132 and a control part 134. The phase control circuit 132 is, for example, a delay circuit for delaying a transmission signal and has a variable element such as a varactor diode. The control part 134 controls the characteristics of a variable element of the phase control circuit 132 to control the phase difference of the signal between the multiple transmission inductors 120 by a unit smaller than 180°. In the example shown in FIG. 1, the phase control circuit 132 is provided for each of the multiple transmission inductors 120, but the phase control circuit 132 does not need to be provided for any one of the transmission inductors 120. The phase control circuit 132 and the control part 134 are comprised of, for example, a transistor and an analog element formed over the substrate 110.

Next, the operation and the effect of the present embodiment will be described. The electronic component 200 on a reception side has a reception inductor 220, and the reception inductor 220 is arranged opposite to the multiple transmission conductors 120. In the example shown in FIG. 1, the center of the reception inductor 220 is positioned between two transmission inductors 120 when viewed in a plan view. When the relative positions of the electronic components 100, 200 are determined, a deviation is caused in the relative positions. In the case where this deviation is large, when the electronic component 100 is provided with one electronic component 100, a region where a magnetic flux produced by the transmission inductor 120 is strong is deviated from the reception inductor 220, whereby a transmission error is caused in some case.

In contrast to this, in this embodiment, the electronic component 100 is provided with the multiple transmission inductors 120. The multiple transmission inductors 120 have their centers deviated from each other when viewed in a plan view. The phase difference of the transmission signals inputted to the multiple transmission inductors 120 is controlled by a unit smaller than 180°. Hence, the distribution of magnetic flux density formed by the multiple transmission inductors 120 can be deviated in a plane parallel to the substrate 110. Hence, this can prevent that the reception inductor 220 cannot receive the signal even when the transmission inductors 120 and the reception inductor 220 are deviated from each other in their relative position.

Second Embodiment

Figure 3:
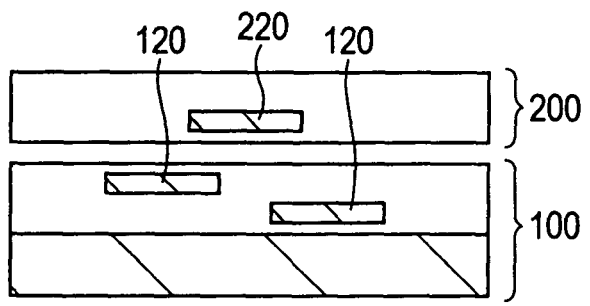
FIG. 3 is a section view to show the configuration of an electronic component according to a second embodiment.
Figure 4:
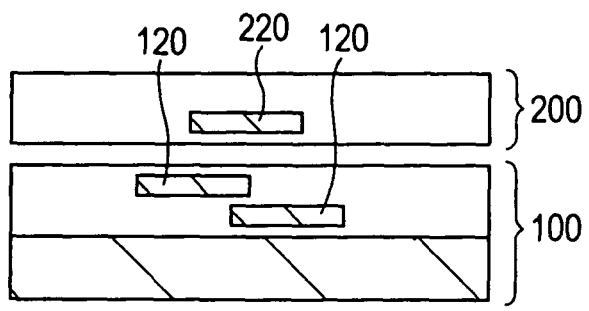
FIG. 4 is a section view to show the configuration of the electronic component according to the second embodiment.

FIG. 3 and FIG. 4 are section views to show the configuration of an electronic component 100 according to a second embodiment. These drawings correspond to FIG. 2 in the first embodiment. The electronic component 100 according to this embodiment has the same configuration as the electronic component 100 according to the first embodiment except that the electronic component 100 according to this embodiment has at least one of the transmission inductors 120 formed in a wiring layer different from a wiring layer having the other transmission inductor 120 formed therein.

The transmission inductors 120 formed in the different wiring layers need not overlap each other when viewed in a plan view, as shown in FIG. 3, or may partially overlap each other, as shown in FIG. 4.

This embodiment also can produce the same effect as the first embodiment. When multiple transmission inductors 120 are arranged in such a way as to partially overlap each other as shown in FIG. 4, of the area of the electronic component 100, the area occupied by the multiple transmission inductors 120 can be reduced.

Third Embodiment

FIG. 5 is a view to show the configuration of an electronic component 100 according to a third embodiment. This drawing corresponds to FIG. 1 in the first embodiment. The electronic component 100 according to this embodiment has the same configuration as the electronic component 100 according to the first embodiment or the second embodiment except that the electronic component 100 according to this embodiment has a transmission signal generation part 170. The transmission signal generation part 170 is coupled to the transmission inductors 120 via a signal input channel 112 and inputs a transmission signal to each of the transmission inductors 120 via a phase control circuit 132. The phase control circuit 132 is comprised of, for example, a transistor or an analog element formed over the substrate 110.

This embodiment also can produce the same effect as the first or the second embodiment. Further, the transmission inductors 120, a phase control section 130, and the transmission signal generation section 170 can be formed as one semiconductor chip using one substrate 110.

Fourth Embodiment

Figure 7:
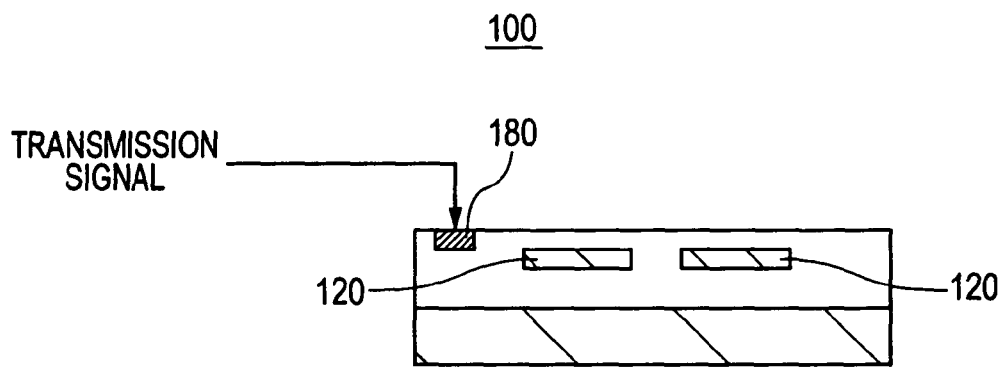
FIG. 7 is a section view to show the configuration of the electronic component shown in FIG. 6.

FIG. 6 is a view to show the configuration of an electronic component 100 according to a fourth embodiment. FIG. 7 is a section view to show the configuration of the electronic component 100 shown in FIG. 6. FIG. 6 corresponds to FIG. 1 in the first embodiment. The electronic component 100 according to this embodiment has the same configuration as the electronic component 100 according to the first embodiment or the second embodiment except that the electronic component 100 according to this embodiment has an input terminal 180.

The electronic component 100 according to this embodiment is, for example, a discrete component and includes only, for example, transmission inductors 120, a phase difference control section 130, the input terminal 180, and wirings or vias to couple these parts. The input terminal 180 is coupled to the transmission inductors 120 via a signal input channel 112 and inputs a transmission signal inputted from an external part to the transmission inductors 120 via the signal input channel 112 and the phase control circuits 132. The input terminal 180 is formed in an uppermost wiring layer and has the same structure as an electrode pad.

This embodiment also can produce the same effect as the first or the second embodiment. Further, the transmission signal produced by the other electronic component can be transmitted to the electronic component 200 via the electronic component 100.

Fifth Embodiment

Figure 8:
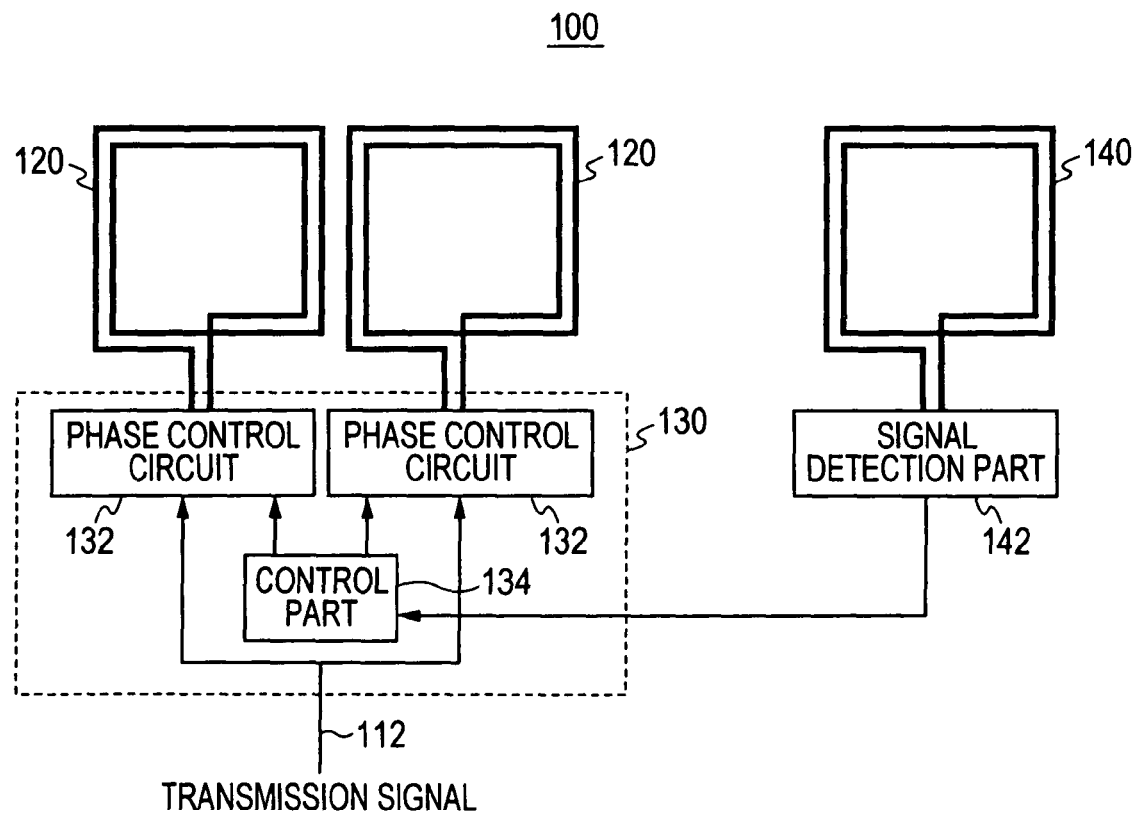
FIG. 8 is a view to show the configuration of an electronic component according to a fifth embodiment.
Figure 9:
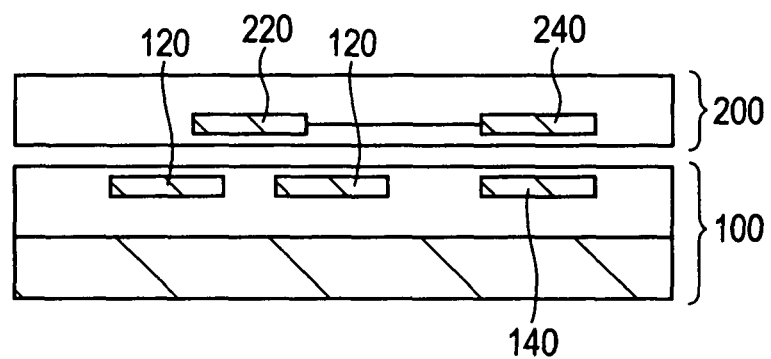
FIG. 9 is a section view to show a sectional structure of the electronic component shown in FIG. 8 in combination with the mode of its use.

FIG. 8 is a view to show the configuration of an electronic component 100 according to a fifth embodiment. FIG. 9 is a section view to show the sectional structure of the electronic component 100 shown in FIG. 8 in combination with the mode of its use. The electronic component 100 according to this embodiment has the same configuration as the electronic component 100 shown in any one of the first to fourth embodiments except that the electronic component 100 according to this embodiment has a reception inductor 140 and a signal detection part 142.

The reception inductor 140 is arranged in such a way as not to overlap the multiple transmission inductors 120 when viewed in a plan view. The signal detection part 142 is coupled to the reception inductor 140 and detects the strength of an induced current produced in the reception inductor 140.

An electronic component 200 on a reception side includes a transmission inductor 240, as shown in FIG. 9. The induced current produced in the reception inductor 220 flows through the transmission inductor 240 as it is or via an amplification circuit. That is, the magnitude of magnetic flux produced by the transmission inductor 240 is proportional to the induced current produced in the reception inductor 220. The transmission inductor 240 is arranged at a position opposite to the reception inductor 140. For this reason, the magnitude of the induced current produced by the reception inductor 140 is proportional to the magnitude of the induced current produced in the reception inductor 220.

The control part 134 of the phase difference control section 130 controls a phase difference on the basis of the strength of the induced current detected by the signal detection part 142. Specifically, the control part 134 controls the phase difference in such a way that the strength of the induced current detected by the signal detection part 142 is made maximum, that is, the induced current produced in the reception inductor 220 is made maximum.

This embodiment also can produce the same effect as the first embodiment. Further, the relative positions of the electronic components 100, 200 are determined and then the control part 134 controls the phase difference in such a way that the strength of the induced current detected by the signal detection part 142, that is, the induced current produced in the reception inductor 220 is made maximum. For this reason, the phase difference can easily be set.

Sixth Embodiment

Figure 10:
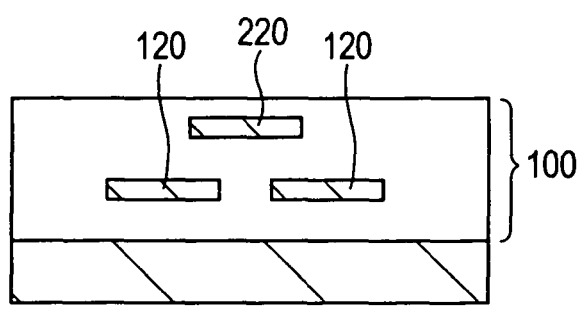
FIG. 10 is a section view to show the configuration of an electronic component according to a sixth embodiment.
Figure 13:
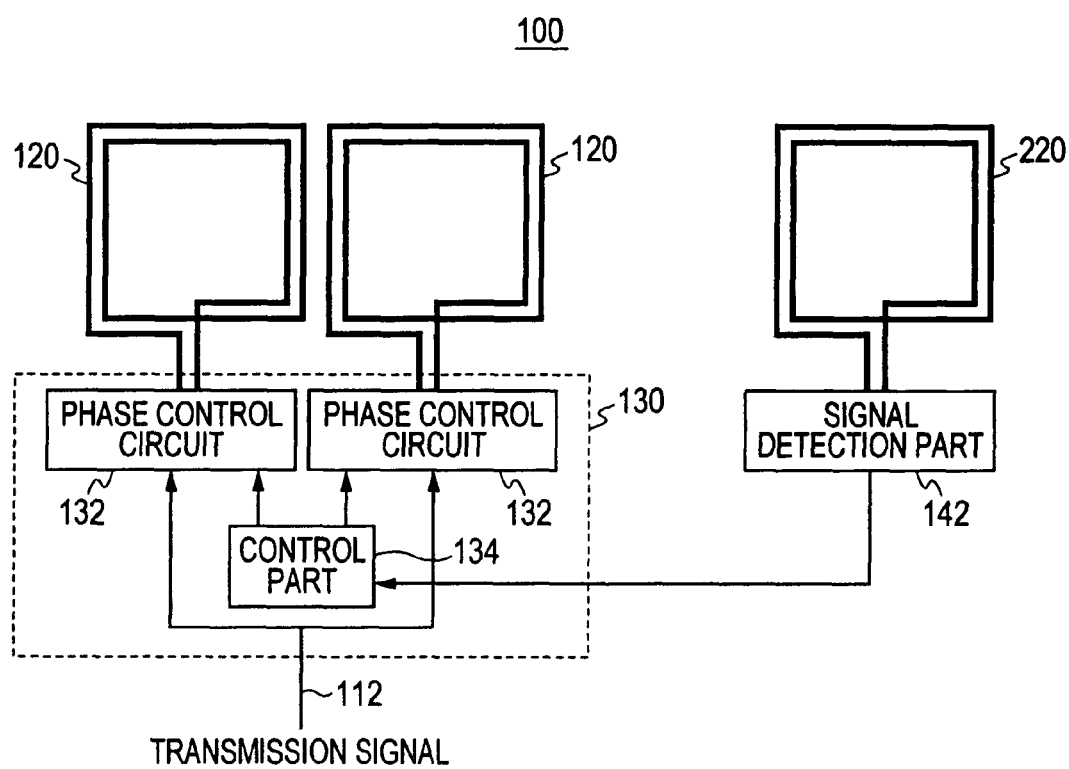
FIG. 13 is a view to show the configuration of the electronic component according to the sixth embodiment.

FIG. 13 and FIG. 10 are views to show the configuration of an electronic component 100 according to a sixth embodiment of the present invention. In this embodiment, as shown in FIG. 10, the reception inductor 220 and the transmission inductors 120 are arranged opposite to each other. For example, the reception inductor 220 and the transmission inductors 120 are formed in different wiring layers. When the reception inductor 220 partially overlaps the transmission inductors 120 when viewed in a plan view, the induced current flowing through the reception inductor 220 can be made larger. Hence, this arrangement is preferable. The reception inductor 220 is coupled to the signal detection part 142, as shown in FIG. 13, and the strength of a reception signal received by the reception inductor 220, specifically, the magnitude of the induced current is detected. The signal detection part 142 inputs the strength of the detected reception signal to the control part 134. The control part 134 controls the phase control circuit 132 in such a way as to enhance the strength of the reception signal. The wiring and the phase control section 130, except for the reception inductor 220 and the transmission inductors 120, are omitted in FIG. 10.

This embodiment also can produce the same effect as the first embodiment. Further, according to this embodiment, the magnetic flux of the transmission inductor 120 is regulated by the phase control circuit 132 in such a way to increase the induced current of the reception inductor 220, so that the signal can be reliably transmitted and received between the reception inductor 220 and the transmission inductors 120.

Although the sixth embodiment has been described with reference to FIG. 10, also in the other respective embodiments, as shown in FIG. 13, the electronic component 100 may be provided with the reception inductor 220 and a reception circuit (not shown). In this case, the reception inductor 220 and the transmission inductors 120 are formed in the different wiring layers, and either of them may be formed in an upper wiring layer.

Further, the layout of the multiple transmission inductors 120 is not limited to the example described above.

Figure 11:
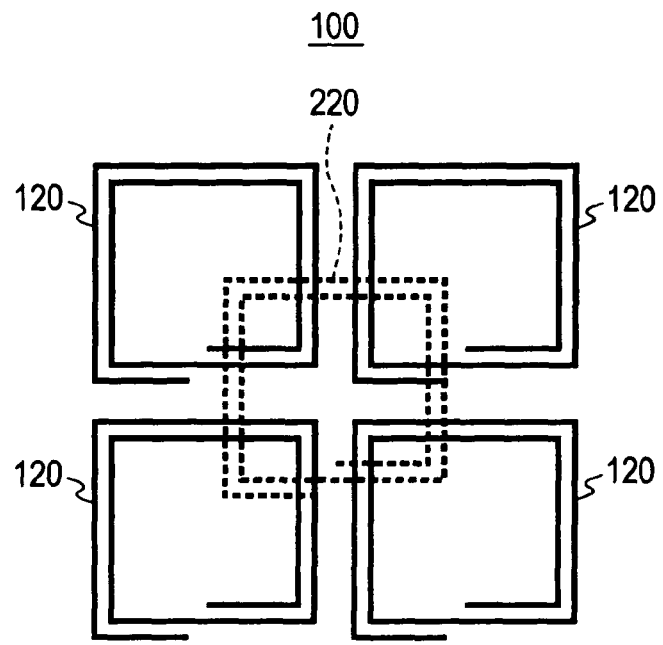
FIG. 11 is a view to show the configuration of an electronic component according to a modified example.

For example, as shown in FIG. 11, four transmission inductors 120 may be arranged in such a way that their centers are positioned at intervals of 90° on the same circumference. In this case, it is preferable that the center of the reception inductor 220 overlaps the center of the circumference.

Figure 12:
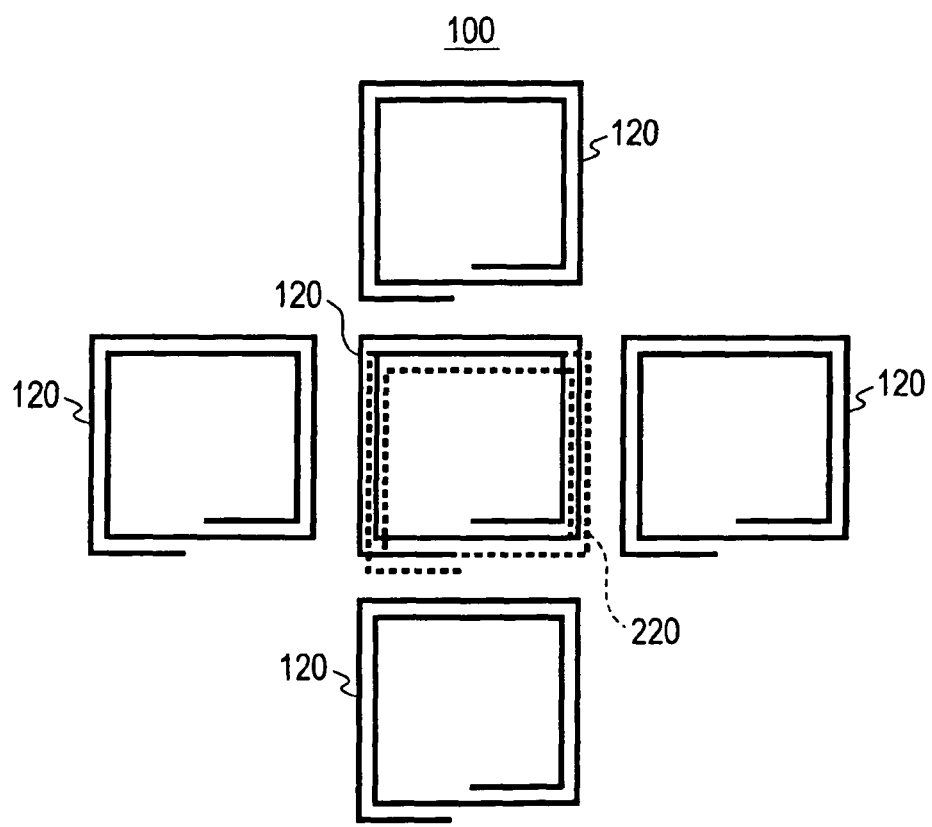
FIG. 12 is a view to show the configuration of an electronic component according to a modified example.

Further, as shown in FIG. 12, four transmission inductors 120 may be arranged around one transmission inductor 120 in such a way that their centers are positioned at intervals of 90° on the same circumference. In this case, it is preferable that the center of the reception inductor 220 overlaps the center of the one transmission inductor 120 positioned at the center.

Up to this point, the embodiments of the present have been described with reference to the drawings, but these are examples of the present invention. Various configurations other than those described above can be also employed.

What is claimed is:

1. An electronic component comprising:
   a plurality of transmission inductors formed over a substrate and arranged in such a way that respective centers of the plurality of transmission inductors are deviated from each other when viewed in a plan view;
   a signal input channel for inputting a transmission signal to each of the plurality of transmission inductors;
   a phase difference control section provided in the signal input channel for controlling a phase difference of the transmission signal between the plurality of transmission inductors, said phase difference being smaller than 180°; and
   at least one wiring layer formed over the substrate,
   wherein the plurality of transmission inductors are formed within the same wiring layer.

2. The electronic component according to claim 1, further comprising:
an input terminal to which the transmission signal is inputted.

3. The electronic component according to claim 1, further comprising:
a transmission signal generation part which generates the transmission signal.

4. An electronic component comprising:
a plurality of transmission inductors formed over a substrate and arranged in such a way that respective centers of the plurality of transmission inductors are deviated from each other when viewed in a plan view;
a signal input channel for inputting a transmission signal to each of the plurality of transmission inductors;
a phase difference control section provided in the signal input channel for controlling a phase difference of the transmission signal between the plurality of transmission inductors, said phase difference being smaller than 180°; and
a plurality of wiring layers formed over the substrate,
wherein at least one of the plurality of transmission inductors is formed in a first one of the plurality of wiring layers different from a second one of the plurality of wiring layers in which the other transmission inductor is formed.

5. An electronic component comprising:
a plurality of transmission inductors formed over a substrate and arranged in such a way that respective centers of the plurality of transmission inductors are deviated from each other when viewed in a plan view;
a signal input channel for inputting a transmission signal to each of the plurality of transmission inductors;
a phase difference control section provided in the signal input channel for controlling a phase difference of the transmission signal between the plurality of transmission inductors, said phase difference being smaller than 180°;
a reception inductor arranged at a position opposite to the plurality of transmission inductors; and
a signal detection part which detects a strength of an induced current produced in the reception inductor, the signal detection part being coupled to the reception inductor,
wherein the phase difference control section controls the phase difference on the basis of the strength detected by the signal detection part.

6. The electronic component according to claim 5,
wherein the plurality of transmission inductors overlap the reception inductor at least partially when viewed in a plan view.

7. The electronic component according to claim 5,
wherein the phase difference control section controls the phase difference to make the strength detected by the signal detection part maximum.

* * * * *